United States Patent
He et al.

(10) Patent No.: US 11,734,944 B2
(45) Date of Patent: Aug. 22, 2023

(54) DISPLAY DEVICE WITH EMBEDDED BIOMETRIC DETECTION FUNCTION IN ACTIVE REGION

(71) Applicant: HIMAX TECHNOLOGIES LIMITED, Tainan (TW)

(72) Inventors: Jia-Ming He, Tainan (TW); Yaw-Guang Chang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 724 days.

(21) Appl. No.: 15/854,725

(22) Filed: Dec. 26, 2017

(65) Prior Publication Data
US 2019/0042825 A1    Feb. 7, 2019

Related U.S. Application Data

(60) Provisional application No. 62/540,577, filed on Aug. 3, 2017.

(51) Int. Cl.
*G06V 40/13* (2022.01)
*G09G 3/34* (2006.01)
(Continued)

(52) U.S. Cl.
CPC ....... *G06V 40/1318* (2022.01); *G09G 3/3233* (2013.01); *G09G 3/3406* (2013.01);
(Continued)

(58) Field of Classification Search
CPC .......................... G06K 9/0004; G09G 3/3406
See application file for complete search history.

(56) References Cited

U.S. PATENT DOCUMENTS 7,136,783 B2 *  11/2006  Linnartz ............... G06F 17/142
                                                    702/190
9,361,507 B1 *   6/2016  Hoyos ................. G06K 9/00073
(Continued)

FOREIGN PATENT DOCUMENTS

CN     1607561 A     4/2005
CN   102662527 A     9/2012
(Continued)

OTHER PUBLICATIONS

Sheng-yi Wu et al., "The research and implementation of visual access control system" Electronic Design Engineering, vol. 23, No. 19, Oct. 2015.

*Primary Examiner* — Gandhi Thirugnanam
(74) *Attorney, Agent, or Firm* — CKC & Partners Co., LLC

(57) ABSTRACT

A display device includes an active matrix substrate and a detection circuit. The active matrix substrate has pixels that are configured to display an image. The pixels include display and photo sensing pixels each including a display region and a photo sensing region. The display region is configured to emit light with a predetermined emitting frequency in a blank period of the display device. The photo sensing region is adjacent to the display region, and is configured to detect the light emitted by the display region and reflected from a biometric object and to convert the reflected light into photo detection signals. The detection circuit is coupled to the photo sensing circuit of each of the display and photo sensing pixels, and is configured to construct a biometric pattern corresponding to the biometric object based on the photo detection signals.

16 Claims, 13 Drawing Sheets

(51) Int. Cl.
  *G09G 3/3233* (2016.01)
  *H10K 59/40* (2023.01)
  *H10K 59/65* (2023.01)
  *G09G 3/36* (2006.01)
  *G06V 40/60* (2022.01)
  *H10K 59/35* (2023.01)

(52) U.S. Cl.
  CPC .............. *H10K 59/40* (2023.02); *H10K 59/65* (2023.02); *G06V 40/67* (2022.01); *G09G 3/3648* (2013.01); *G09G 2300/0842* (2013.01); *G09G 2320/064* (2013.01); *G09G 2354/00* (2013.01); *G09G 2380/08* (2013.01); *H10K 59/35* (2023.02)

(56) References Cited

U.S. PATENT DOCUMENTS

| | | | | |
|---|---|---|---|---|
| 9,424,458 | B1 * | 8/2016 | Mather | G06K 9/00114 |
| 9,639,733 | B2 * | 5/2017 | Kremin | G06K 9/0002 |
| 10,007,828 | B2 * | 6/2018 | Han | G06F 3/0416 |
| 10,541,280 | B1 * | 1/2020 | Krah | G06F 3/041661 |
| 2002/0030668 | A1 * | 3/2002 | Hoshino | G06F 3/0421 |
| | | | | 345/175 |
| 2002/0167489 | A1 | 11/2002 | Davis | |
| 2004/0252867 | A1 * | 12/2004 | Lan | G06K 9/0004 |
| | | | | 382/124 |
| 2008/0129653 | A1 * | 6/2008 | Yamazaki | G06F 3/0412 |
| | | | | 345/55 |
| 2008/0211787 | A1 * | 9/2008 | Nakao | G06F 3/042 |
| | | | | 345/175 |
| 2016/0110025 | A1 * | 4/2016 | Hossu | G06K 9/00013 |
| | | | | 382/124 |
| 2016/0253544 | A1 * | 9/2016 | Weber | G06F 1/1626 |
| | | | | 382/124 |
| 2016/0321442 | A1 * | 11/2016 | Song | H01H 13/04 |
| 2016/0349882 | A1 * | 12/2016 | Liu | G06F 3/044 |
| 2017/0024602 | A1 * | 1/2017 | Han | G06K 9/00013 |
| 2017/0154199 | A1 * | 6/2017 | Li | G02F 1/133514 |
| 2017/0228579 | A1 * | 8/2017 | Zhu | G06K 9/0004 |
| 2017/0337413 | A1 * | 11/2017 | Bhat | G06K 9/0002 |
| 2017/0365588 | A1 * | 12/2017 | Chen | H01L 33/62 |
| 2018/0046025 | A1 * | 2/2018 | Liu | G09G 3/34 |
| 2018/0060641 | A1 * | 3/2018 | Kim | G06K 9/0004 |
| 2018/0151122 | A1 * | 5/2018 | Ding | G06K 9/00993 |
| 2018/0225457 | A1 * | 8/2018 | Barsness | G06F 21/35 |
| 2018/0285619 | A1 * | 10/2018 | Kim | G09G 3/3208 |
| 2018/0365468 | A1 * | 12/2018 | Wang | G02F 1/13306 |
| 2019/0042825 | A1 * | 2/2019 | He | G06K 9/0004 |
| 2020/0051499 | A1 * | 2/2020 | Chung | G09G 3/3275 |

FOREIGN PATENT DOCUMENTS

| | | | | |
|---|---|---|---|---|
| CN | 102736794 A | | 10/2012 | |
| CN | 105303090 A | * | 2/2016 | ............ G06F 21/32 |
| CN | 105511931 A | * | 4/2016 | |
| CN | 105718118 A | | 6/2016 | |
| CN | 105893992 A | | 8/2016 | |
| CN | 106233305 A | | 12/2016 | |
| CN | 106326859 A | | 1/2017 | |
| CN | 106598327 A | | 4/2017 | |
| CN | 106874725 A | * | 6/2017 | |
| CN | 106886743 A | | 6/2017 | |
| CN | 106898636 A | | 6/2017 | |
| CN | 107004130 A | | 8/2017 | |
| TW | 201704969 A | | 2/2017 | |

* cited by examiner

DISPLAY DEVICE WITH EMBEDDED BIOMETRIC DETECTION FUNCTION IN ACTIVE REGION

RELATED APPLICATIONS

This application claims priority to U.S. Provisional Application Ser. No. 62/540,577, filed Aug. 3, 2017, which is herein incorporated by reference.

BACKGROUND

Field of the Invention

The invention relates to a display device, and more particularly to a display device with an embedded biometric detection function in an active region thereof.

Description of Related Art

For the conventional electronic products, biometric detection technologies have been widely applied for various applications, such as identity verification, access control, or the like. For example, more and more conventional mobile phones or tablets are equipped with a fingerprint recognition function to conveniently identify a person. However, a fingerprint recognition IC has to be arrange in a non-active region of a mobile phone to avoid affecting original image display, and thus how to arrange the fingerprint recognition IC in the non-active region of such mobile phone according to a design requirement has to be taken into consideration.

SUMMARY

The invention provides a display device and an electronic device and a biometric detection method thereof. In the invention, a biometric detection function is embedded in an active region of a display device without requiring an additional displacement in a non-active region and affecting original image display, thus providing more conveniently and flexibly.

One aspect of the invention is directed to a display device, which includes an active matrix substrate and a detection circuit. The active matrix substrate has pixels that are configured to display an image. The pixels include display and photo sensing pixels each including a display region and a photo sensing region. The display region is configured to emit light with a predetermined emitting frequency in a blank period of the display device. The photo sensing region is adjacent to the display region, and is configured to detect the light emitted by the display region and reflected from a biometric object and to convert the reflected light into photo detection signals. The detection circuit is coupled to the photo sensing circuit of each of the display and photo sensing pixels, and is configured to construct a biometric pattern corresponding to the biometric object based on the photo detection signals.

In accordance with one or more embodiments of the invention, the biometric pattern is a fingerprint pattern.

In accordance with one or more embodiments of the invention, the display device further includes a backlight module that is configured to provide backlight with the predetermined emitting frequency to the active matrix substrate in the blank period of the display device.

In accordance with one or more embodiments of the invention, the pixels are organic light-emitting diode (OLED) pixels.

In accordance with one or more embodiments of the invention, the pixels are micro light-emitting diode (mLED) pixels.

In accordance with one or more embodiments of the invention, a number of the display and photo sensing pixels is less than a number of the pixels.

In accordance with one or more embodiments of the invention, each of the pixels comprises a red subpixel, a green subpixel and a blue subpixel.

Another aspect of the invention is directed to an electronic device, which includes a display module, a detection circuit and a processor. The display device includes an active matrix substrate with pixels that are configured to display an image. The pixels include display and photo sensing pixels each including a display region and a photo sensing region. The display region is configured to emit light. The photo sensing region is adjacent to the display region, and is configured to detect the light emitted by the display region and reflected from a biometric object and to convert the reflected light into photo detection signals. The detection circuit is coupled to the photo sensing circuit of each of the display and photo sensing pixels, and is configured to construct a biometric pattern corresponding to the biometric object based on the photo detection signals. The processor is configured to execute instructions to: determine a biometric detecting area of the display module; control the display region of each of the determined display and photo sensing pixels to activate light emitting with a predetermined emitting frequency in a blank period of the display module; and control the photo sensing region of each of the determined display and photo sensing pixels to activate biometric object sensing. Determined ones of the display and photo sensing pixels are in the biometric detecting area.

In accordance with one or more embodiments of the invention, the processor is further configured to execute the instructions to control the display module to display a graphical user interface (GUI) that indicates the biometric detecting area.

In accordance with one or more embodiments of the invention, the biometric pattern is a fingerprint pattern.

In accordance with one or more embodiments of the invention, the display module includes a backlight module, and the processor is further configured to execute the instructions to control the backlight module to provide backlight with the predetermined emitting frequency to the active matrix substrate in the blank period of the display module.

In accordance with one or more embodiments of the invention, the pixels are organic light-emitting diode (OLED) pixels.

In accordance with one or more embodiments of the invention, the pixels are micro light-emitting diode (mLED) pixels.

In accordance with one or more embodiments of the invention, a number of the display and photo sensing pixels is less than a number of the pixels.

In accordance with one or more embodiments of the invention, a number of the determined display and photo sensing pixels is less than a number of the display and photo sensing pixels.

In accordance with one or more embodiments of the invention, each of the pixels comprises a red subpixel, a green subpixel and a blue subpixel.

In accordance with one or more embodiments of the invention, the electronic device further includes a memory that is configured to store the instructions.

Another aspect of the invention is directed to a biometric detection method of a display device. The display device has an active matrix substrate with pixels that are configured to display an image. The pixels include display and photo sensing pixels. The biometric detecting method includes: emitting light with a predetermined emitting frequency in a blank period of the display device from a display region of each of the display and photo sensing pixels; detecting the light that is emitted from the display region and reflected from a biometric object from a photo sensing region of each of the determined display and photo sensing pixels; converting the reflected light into photo detection signals; and constructing a biometric pattern corresponding to the biometric object based on the photo detection signals.

In accordance with one or more embodiments of the invention, the biometric detection method further includes: determining a biometric detecting area of the display device; and displaying a graphical user interface (GUI) by the determined display and photo sensing pixels. Determined ones of the display and photo sensing pixels are in the biometric detecting area, and the GUI indicates the biometric detecting area.

In accordance with one or more embodiments of the invention, the biometric pattern is constructed as a fingerprint pattern.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the invention is described as following. The described preferred embodiments are presented for purposes of illustrations and description, and they are not intended to limit the scope of the invention.

In the following description and claims, the term "coupled" along with their derivatives, may be used. In particular embodiments, "coupled" may be used to indicate that two or more elements are in direct physical or electrical contact with each other, or may also mean that two or more elements may not be in direct contact with each other. "Coupled" may still be used to indicate that two or more elements cooperate or interact with each other.

Figure 1:
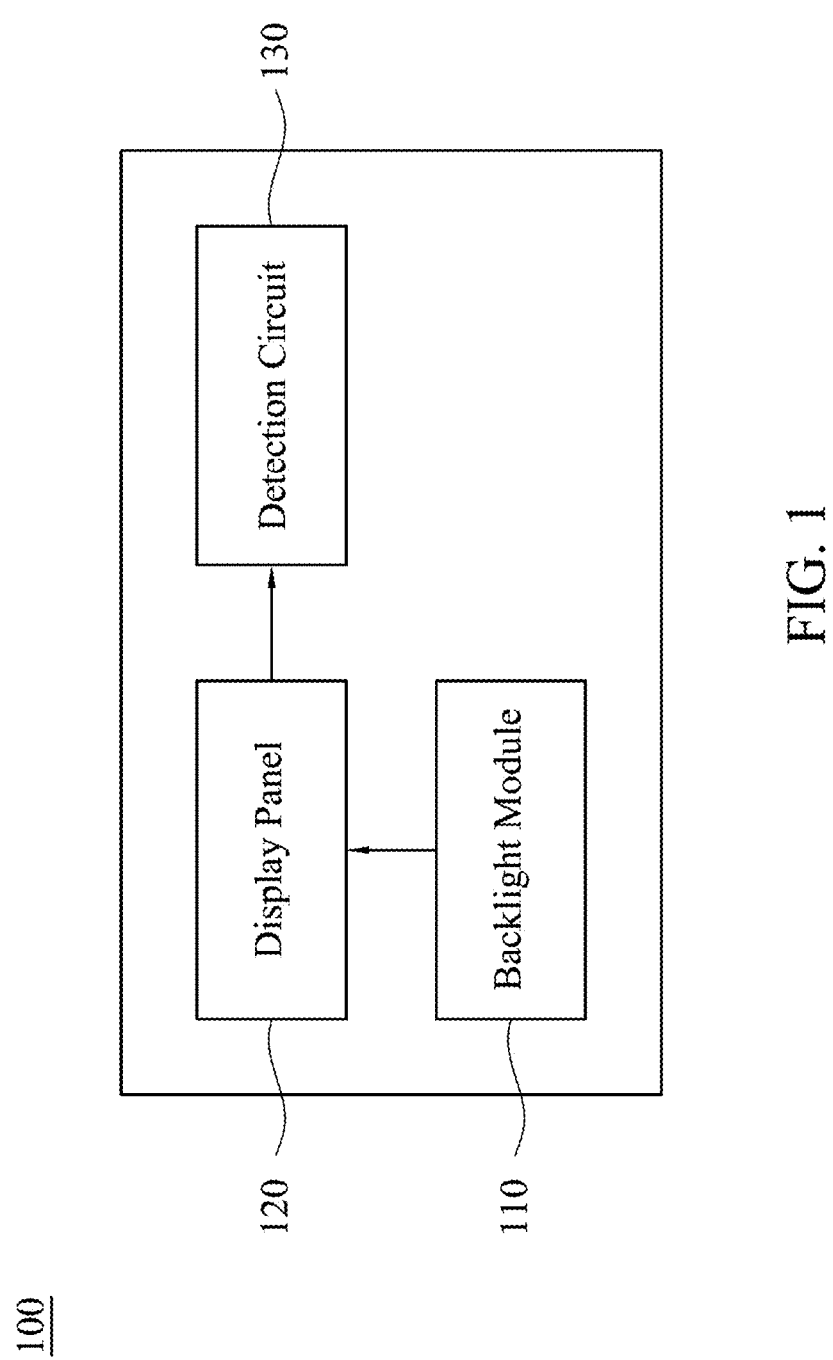
FIG. 1 is a schematic diagram of a display device in accordance with some embodiments of the invention.

Referring to FIG. 1, FIG. 1 is a schematic diagram of a display device 100 in accordance with some embodiments of the invention. The display device 100 may be, for example, a liquid crystal display (LCD) of twisted menatic (TN) type, vertical alignment (VA) type, in-plane switching (IPS) type, fringe-field switching (FFS) type, or the like. The display device 100 includes a backlight module 110, a display panel 120 and a detection circuit 130. The backlight module 110 is configured to output light for display and biometric detection. The backlight module 110 may have a light source (not shown) that is configured to emit light and a light guide plate (not shown) that is disposed to guide the light to penetrate into the display panel 120. The light source (not shown) may be one or more light-emitting diodes (LEDs), one or more cold cathode fluorescent lamps (CCFLs), or another suitable light source. The light generated by the light source (not shown) may be white light, red light, greed light, blue light, or the like. In addition, the light guide plate (not shown) may have a reflector film, microstructures and /or another element to change the light propagation path therein.

Figure 2:
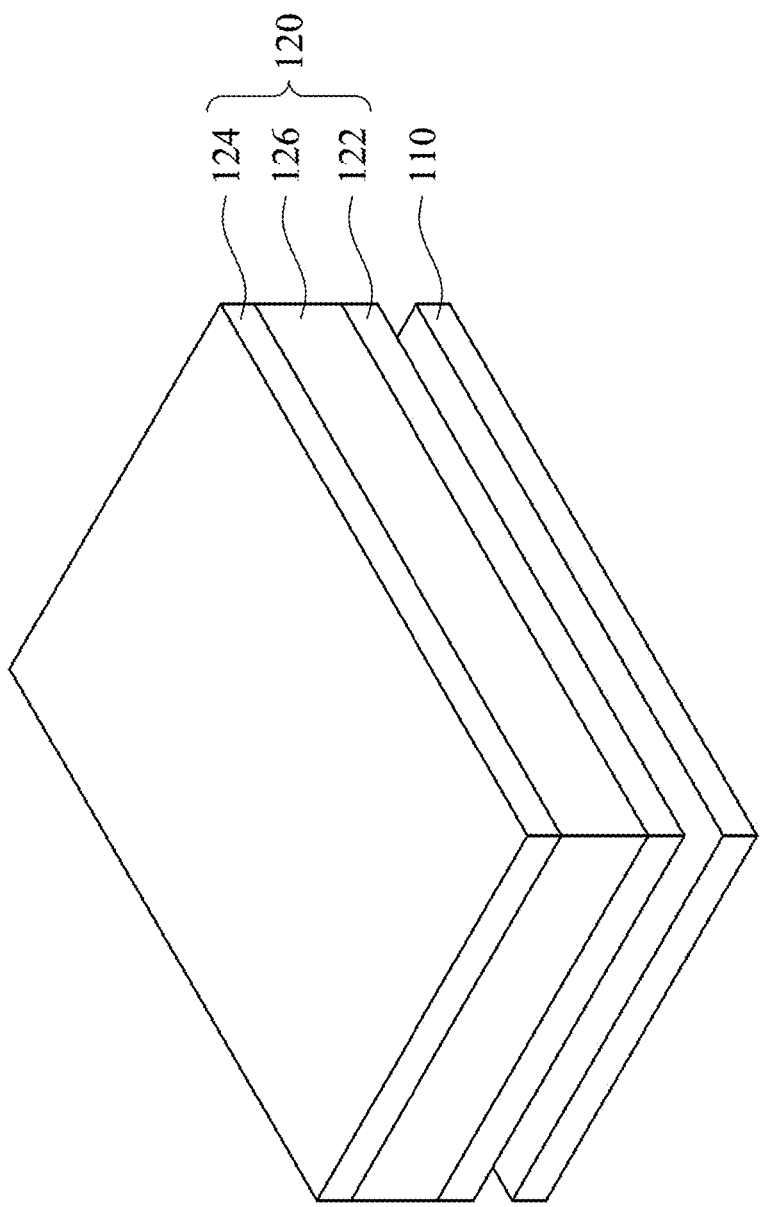
FIG. 2 is an exemplary structural view of a backlight module and a display panel in FIG. 1 in accordance with some embodiments of the invention.

Also referring to FIG. 2, which is an exemplary structural view of the backlight module 110 and the display panel 120 in accordance with some embodiments of the invention. The display panel 120 is disposed on the backlight module 110, such that the bottom of the display panel 120 receives light from the backlight module 110. In some embodiments, as shown in FIG. 2, the display panel 120 includes an active matrix substrate 122, a color filter substrate 124 and a liquid crystal layer 126. The active matrix substrate 122 includes pixels that are arranged in a matrix. The color filter substrate 124 is disposed opposite to the active matrix substrate 122, and the liquid crystal layer 126 is sandwiched between the active matrix substrate 122 and the color filter substrate 124.

Figure 3:
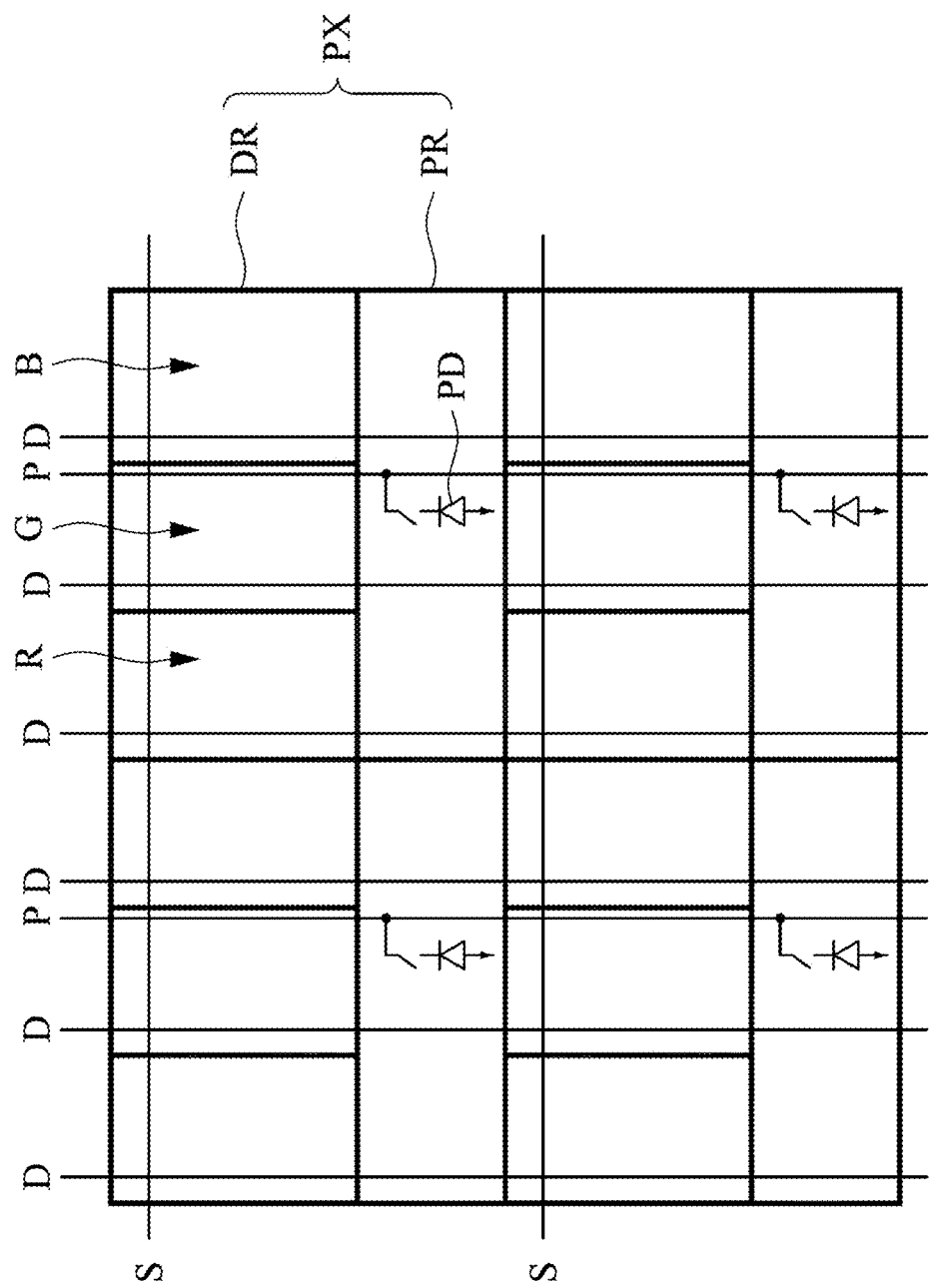
FIG. 3 is a schematic partial view of pixels in accordance with some embodiments of the invention.
Figure 4:
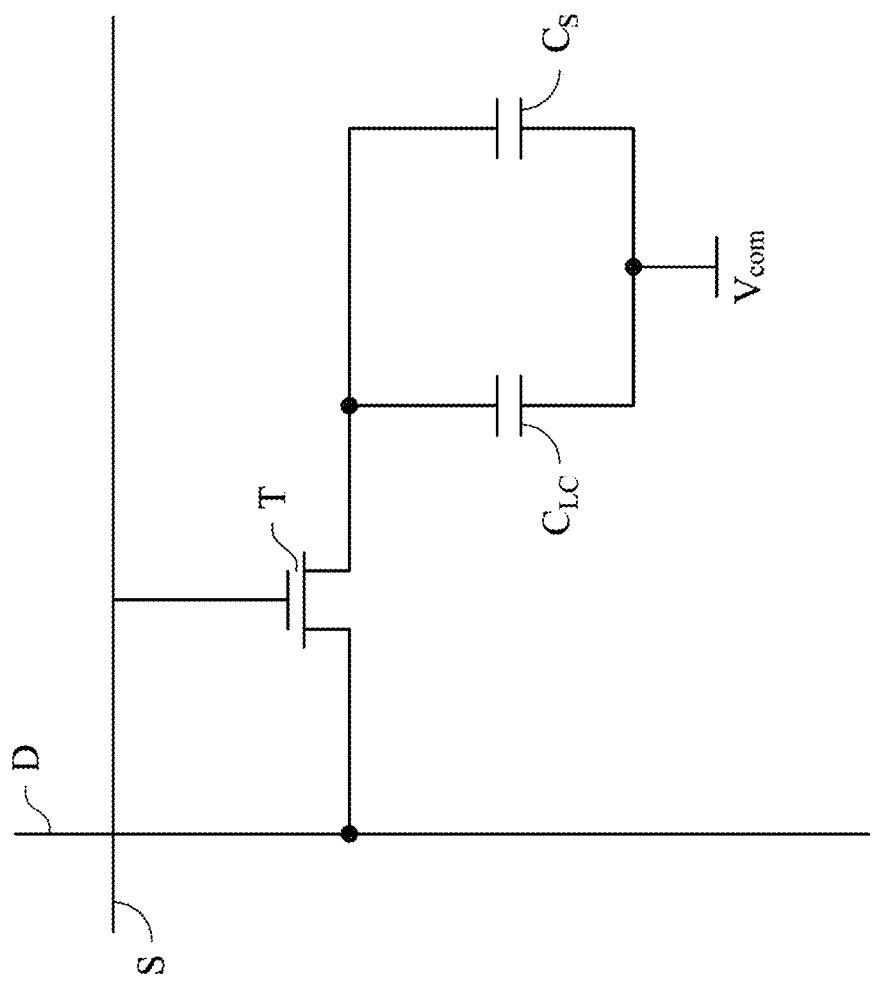
FIG. 4 is an equivalent circuit diagram of a subpixel in accordance with some embodiments of the invention.

Also referring to FIG. 3, which is a schematic partial top view of the active matrix substrate 122 in accordance with some embodiments of the invention. As shown in FIG. 3, the active matrix substrate 122 has pixels PX that are arranged in a matrix. Each of display and photo sensing pixels among the pixels PX includes a display region DR and a photo sensing region PR. That is, some of the pixels PX are display and photo sensing pixels each including a display region DR and a photo sensing region PR; the number of the display and photo sensing pixels is less than the number of the pixels PX. The display region DR configured to emit light with a predetermined emitting frequency in a blank period of the display device. Each display region includes three subpixels, i.e. a red subpixel R, a green subpixel G and a blue subpixel B. Each subpixel is associated with a data line D and a scan line S. That is, each subpixel receives a data signal from a corresponding data line D and a scan signal from a corresponding scan line S. Also referring to FIG. 4, which is an equivalent circuit diagram of a subpixel (the red subpixel R, the green subpixel G or the blue subpixel B) in accordance with some embodiments of the invention. Each pixel has a transistor T, a liquid crystal capacitor $C_{LC}$ and a storage capacitor $C_S$. The transistor T is coupled to the data line D and the scan line S for controlling a display period and a gray level in each frame period. The liquid crystal capacitor $C_{LC}$ and the storage capacitor $C_S$ are connected in parallel and are electrically connected to the transistor T. The liquid crystal capacitor $C_{LC}$ is formed form the pixel electrode of the active matrix substrate 122, the common electrode of the color filter substrate 124 and the liquid crystals of the liquid crystal layer 126 interposed between the pixel electrode and the common electrode. The storage capacitor $C_S$ is configured to store electrical charges during a pixel charge stage.

Referring back to FIG. 3, each of the photo sensing regions PR has a photodiode PD arranged therein. Each of the photodiodes PD is controlled by a corresponding photo sensing control line P. The photo sensing control line P enables the photodiode PD to perform photo sensing during each blank period of the display device 100 and disables the photodiode PD during each display period.

Referring back to FIG. 1, the detection circuit 130 is coupled to the display panel 120 to receive the photo detection signals and then performs an operation on the photo detection signals, so as to construct a biometric pattern corresponding to the biometric object based on the photo detection signals. The biometric pattern corresponds to the biometric object in accordance with various embodiments. In some embodiments, the biometric pattern is a fingerprint pattern if the biometric object is a fingerprint of a human finger.

Figure 5:
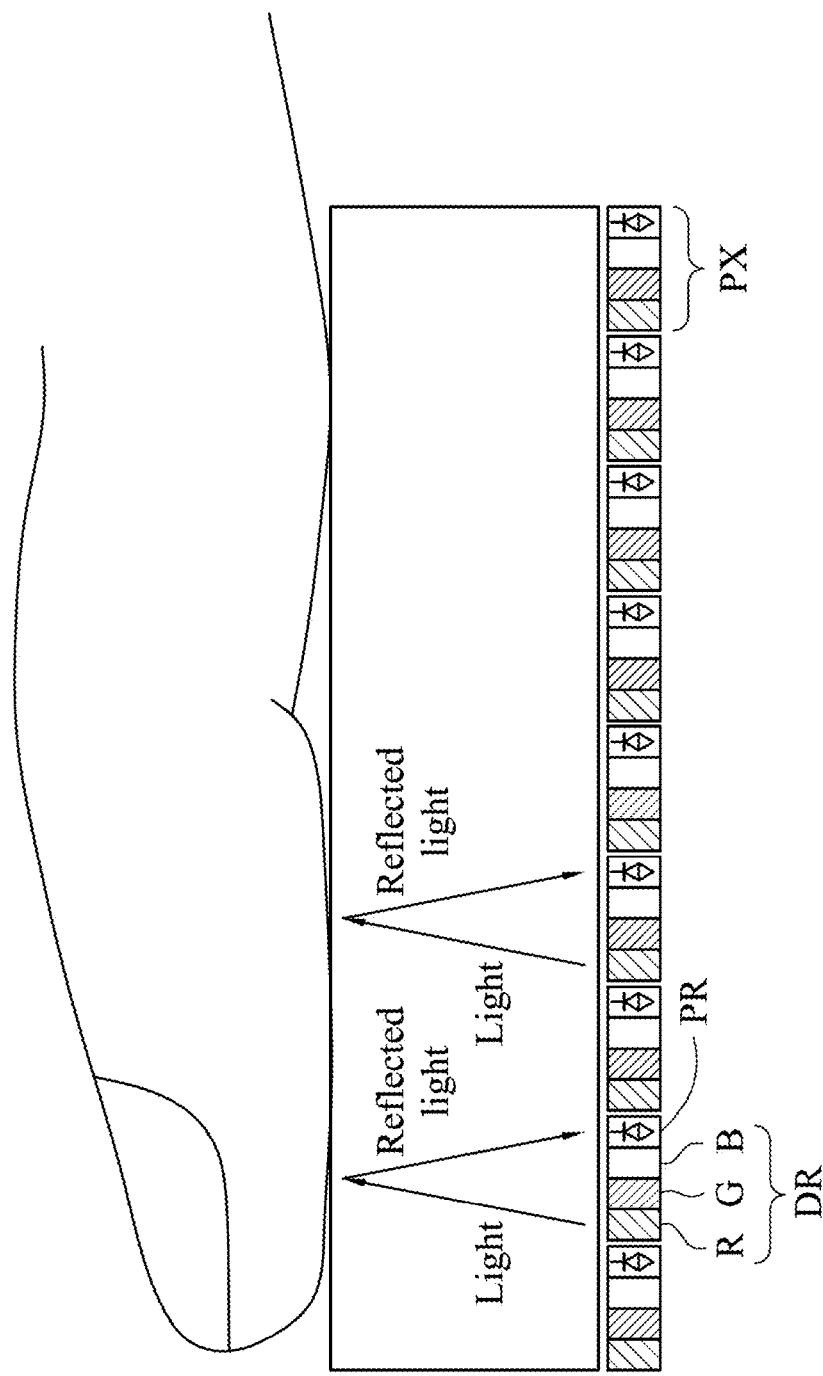
FIG. 5 exemplarily illustrates a fingerprint detection mechanism in accordance with some embodiments of the invention.

FIG. 5 exemplarily illustrates a biometric detection mechanism in accordance with some embodiments of the invention. In the biometric detection mechanism, light emitted by the backlight module 110 penetrates through the red subpixel R, the green subpixel G and the blue subpixel B of the display pixel DR of each of the pixels PX and towards the upper surface of the display panel 120. For example, when a human finger is pressed on the upper surface of the display module 120, the penetrated light is reflected by the human finger, and then the reflected light is received in the photo sensing region PR of each of the pixels PX. The reflected light received in the photo sensing region PR of a pixel PX may be originated from the light penetrating in the display region DR of the same pixel PX or different pixels PX. After receiving the reflected light, a photo sensing element in each of the photo sensing regions PR performs a light-electricity function, so as to convert the received light into the photo detection signals.

Figure 6:
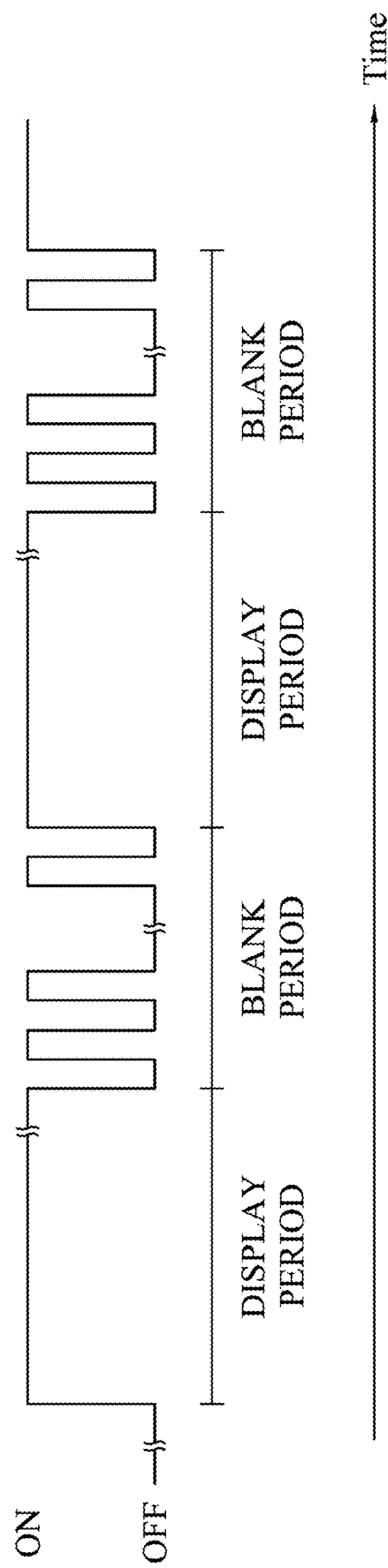
FIG. 6 exemplarily illustrates a time sequential diagram of the light emitted by the backlight module in FIG. 1 in accordance with some embodiments of the invention.

FIG. 6 exemplarily illustrates a time sequential diagram of the light emitted by the backlight module 110 in accordance with some embodiments of the invention. As shown in FIG. 6, in the display period of the display device 100, the light by the backlight module 110 is constantly bright for image display; in the blank period of the display device 100, the light by the backlight module 110 changes from bright to dark and from dark to bright repeatedly for biometric detection. The time sequential diagram in FIG. 6 may also be applied to light illuminating elements of a display device in the embodiments where the display device is an OLED display device or an mLED display device.

Figure 7:
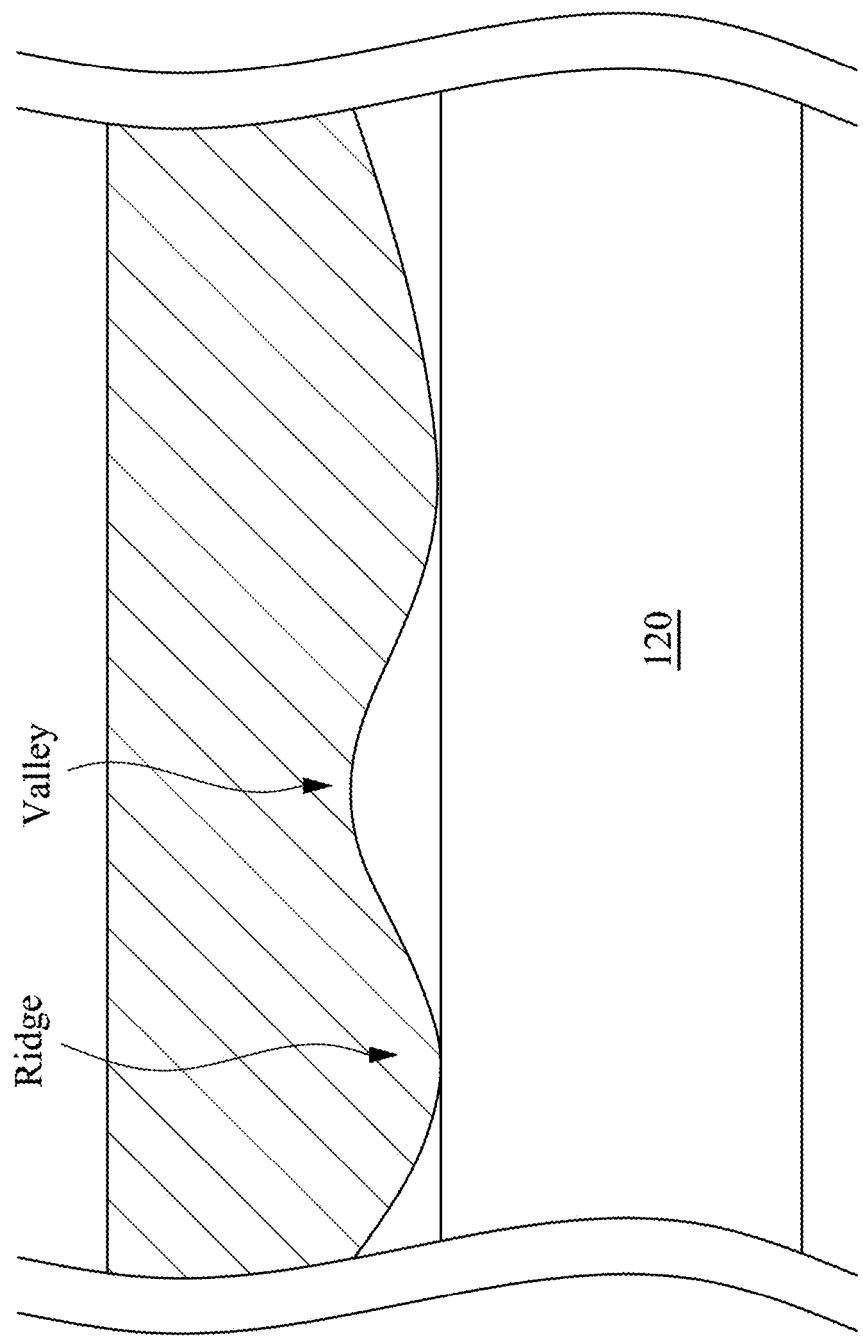
FIG. 7 exemplarily shows a human finger placed on the display panel in FIG. 1.

FIG. 7 exemplarily shows a human finger placed on the display panel 120. As shown in FIG. 7, when the human finger is placed on the display panel 120, the ridges touches the top surface of the display panel 120, and air gaps exist between the valleys and the top surface of the display panel 120. A fingerprint pattern of the human finger may be determined based on the abovementioned difference. In some embodiments, the reflected light corresponding to the valley is stronger than the reflected light corresponding to the ridge.

Figure 8:
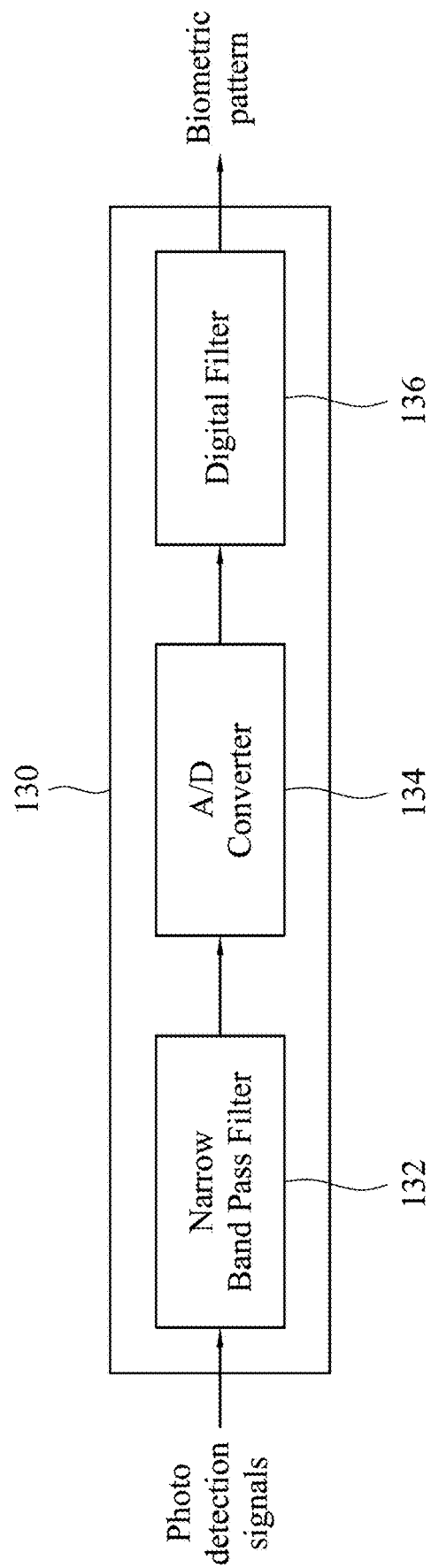
FIG. 8 is a schematic diagram of a detection circuit in FIG. 1 in accordance with some embodiments of the invention.

FIG. 8 is a schematic diagram of the detection circuit 130 in FIG. 1 in accordance with some embodiments of the invention. The detection circuit 130 includes a narrow band pass filter 132, an analog-to-digital converter 134 and a digital filter 136. The narrow band pass filter 132 passes components of the photo detection signals with a particular frequency or within a particular range and blocks the other components of the photo detection signals out of the particular frequency or the particular frequency range. The narrow band pass filter 132 may be configured corresponding to the backlight module 110. For example, if the predetermined emitting frequency of the backlight module 110 in the blank period is $10^5$ Hz, the passing frequency range of the narrow band pass filter 132 may be with a center frequency of about $10^5$ Hz.

The analog-to-digital converter 134 converts the photo detection signals from an analog form to a digital form. The digital filter 136 is used to define regions corresponding to two opposite characteristics of the biometric object to generate a biometric image, e.g. by enhancing the differences between the photo detection signals respectively corresponding to the two opposite characteristics.

In addition to the display device 100 in FIG. 1, the detection circuit 130 may also be applied to another type display device. That is, the display panel 120 of the display device 100 may be another type display panel, such as an organic light-emitting diode (OLED) display panel or a micro light-emitting diode (mLED) display panel, of which a pixel arrangement is similar to that of the display panel 120.

Figure 9:
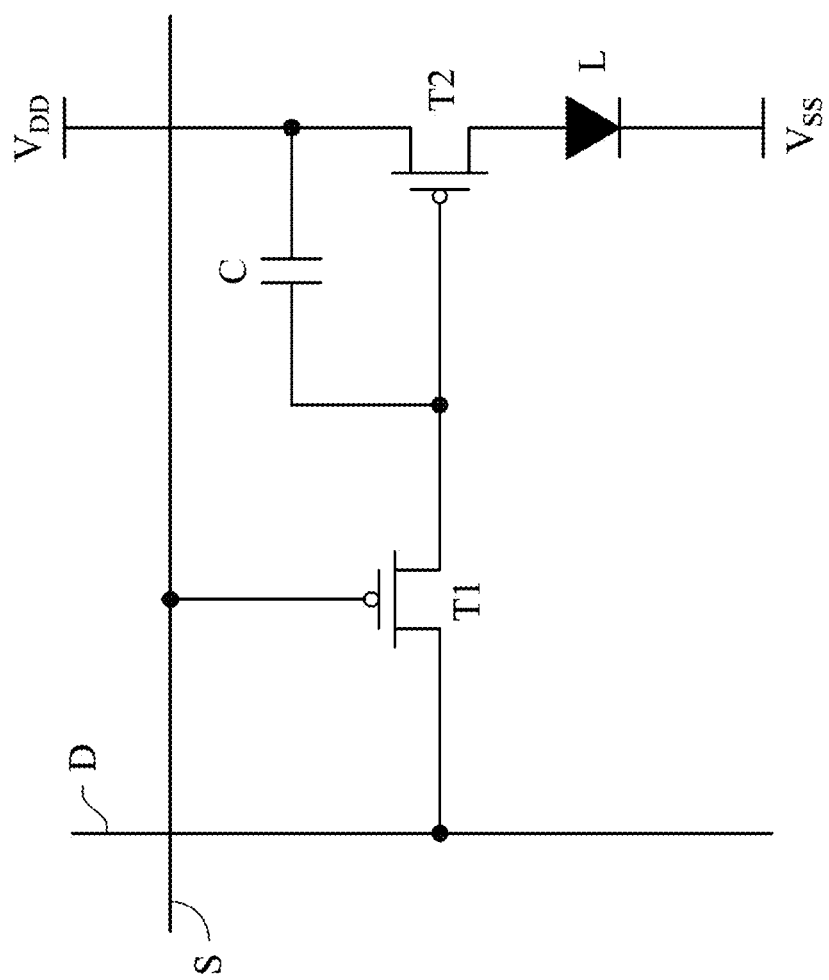
FIG. 9 is a variant equivalent circuit diagram of a subpixel in accordance with some embodiments of the invention.

In some embodiments, the display panel 120 is an OLED display panel, and an exemplary circuit diagram of each pixel in such OLED display panel is illustrated in FIG. 9. As shown in FIG. 9, each pixel includes a data transistor T1, a driving transistor T2, a storage capacitor C and an OLED L. The data transistor T1 and the driving transistor T2 can be of any type, such as thin film transistor (TFT) or the like. In one example shown in FIG. 9, the data transistor T1 and the driving transistor T2 are PMOS transistors. A gate electrode of the data transistor T1 is coupled to a scan line S for receiving a scan signal, and a first source/drain electrode of the data transistor T1 is coupled to a data line D for receiving a data signal. A gate of the driving transistor T2 is coupled to a second source/drain electrode of the data transistor T1, and a first source/drain electrode is coupled to a power supply source $V_{DD}$. Two ends of the storage capacitor C are respectively coupled to the gate electrode and the first source/drain electrode of the driving transistor T2. An anode electrode of the OLED L is coupled to a second source/drain electrode of the driving transistor T2, and a cathode electrode of the OLED L is coupled to a ground voltage $V_{SS}$.

Moreover, in some embodiments, the display panel 120 is an mLED display panel. In such case, for each pixel, the OLED L is substituted by an mLED, and the other components (e.g. the data transistor T1, the driving transistor T2 and the capacitor C) may remain the same.

Figure 10:
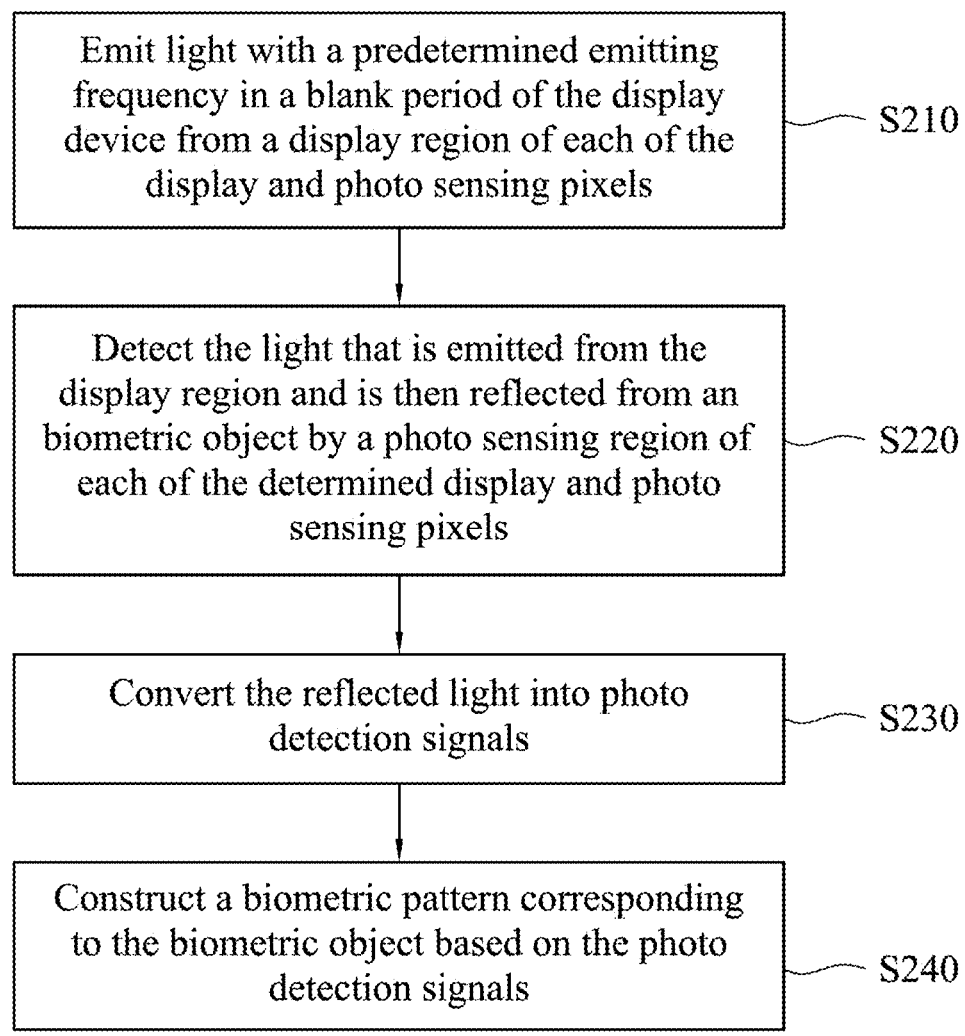
FIG. 10 is a flowchart diagram of a biometric detection method in accordance with some embodiments of the invention.

FIG. 10 is a flowchart of a biometric detection method 200 in accordance with one or more embodiments of the invention. The biometric detection method 200 may be applied on various types of display devices, such as the display device 100 shown in FIG. 1 or another display device that has a pixel arrangement similar to that of the display device 100. In the following description, the display device on which the biometric detection method 200 is applied has an active matrix substrate with pixels that are configured to display an image and include display and photo sensing pixels, and each of the display and photo sensing pixels includes a display region and a photo sensing region, e.g., as shown in FIG. 3.

The biometric detection method 200 includes the following steps. In Step S210, light is emitted with a predetermined emitting frequency in a blank period (i.e. a non-display period) of the display device by a display region of each of the display and photo sensing pixels. The predetermined emitting frequency in the blank period may be high than a human eye is aware of, i.e., the human eyes is not aware of light hopping. In some embodiments, the predetermined emitting frequency in the blank period is higher than 60 Hz, and in particular, about $10^5$ Hz. The light may be emitted by one or more backlight sources, OLEDs or mLEDs according to the type of the display device, such as an LCD device, an OLED display device, an mLED display device or the like.

When a biometric object is placed onto a display surface of the display device, the light emitted from the display region is then reflected by the biometric object, e.g. as shown in FIG. 5 and FIG. 7.

In Step S220, the light emitted from the display region and then reflected from the biometric object is detected by a photo sensing region of each of the determined display and photo sensing pixels. The photo sensing region may include a photo sensing element for detecting the light, such as a photodiode, a pinned photodiode, a partially pinned photodiode, a photogate, a photo transistor, or another element that has a light sensing function.

In Step S230, the reflected light is converted into photo detection signals by the photo sensing element in each of the photo sensing region, and then the photo detection signals are transmitted to a detection circuit. The detection circuit may be included the display device and may be such as the detection circuit shown in FIG. 3 or another detection circuit suitable for performing an operation on the photo detection signals.

In Step S240, the detection circuit performs an operation on the photo detection signals, so as to construct a biometric pattern corresponding to the biometric object based on the photo detection signals. The biometric pattern may be a fingerprint pattern if the biometric object is a fingerprint of a human finger.

Figure 11:
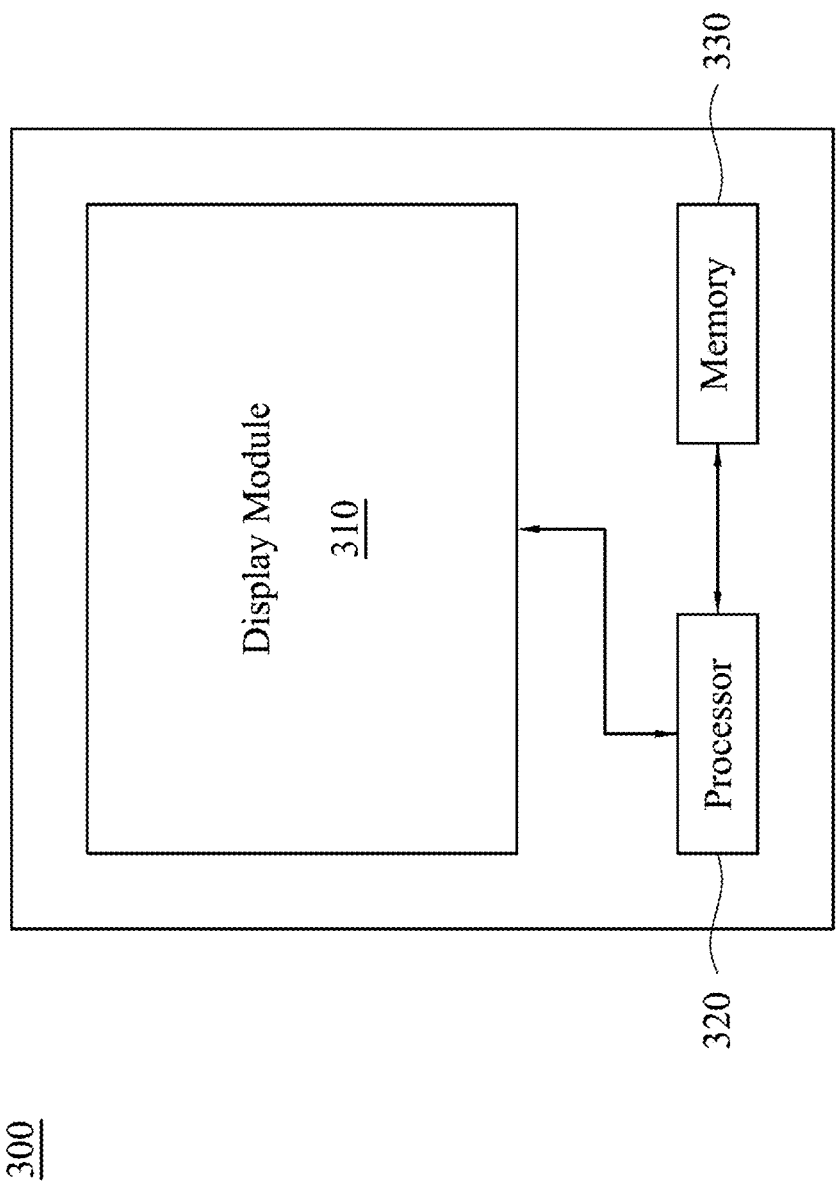
FIG. 11 is a schematic diagram of an electronic device in accordance with some embodiments of the invention.

FIG. 11 is a schematic diagram of an electronic device 300 in accordance with some embodiments of the invention. The electronic device 300 may be, for example, a mobile phone, a smartphone, a tablet, a laptop computer, or another similar portable device. In some other embodiments, the electrically device is an ATM, a kiosk, a robot, a vending machine or another device that may apply a biometric detection technology for customer services, access controls, or the like. As shown in FIG. 11, the electronic device 300 includes a display module 310, a processor 320 and a memory 330.

The display module 310 provides a display function and a light sensing function. The display device 100 may be, for example, a liquid crystal display (LCD) of twisted menatic (TN) type, vertical alignment (VA) type, in-plane switching (IPS) type, fringe-field switching (FFS) type, or an organic light-emitting diode (OLED) display panel, a micro light-emitting diode (mLED) display panel or a display of another type. The display module 310 may be similar to the display device 100 in FIG. 1 of another display module that is capable of performing a display function and a light sensing function. In some embodiments, the display module 310 includes the backlight module 110 and the display panel 120 in FIG. 1.

The processor 320 is coupled to the display module 310 and controls operations of the display module 310. Specifically, the processor 320 may control the display module 310 to display an image on screen of the display module 310. For the embodiments in which the display module 310 includes an LCD display panel, the processor 320 may control the liquid crystal layer and the backlight module of the display module 310 to show a particular graphical user interface (GUI) to guide a user to perform a corresponding action. Oppositely, for the embodiments in which the display module 310 includes an OLED display panel or an mLED display module, the processor 320 may control light illuminating elements (e.g. OLEDs or mLEDs) respectively in the pixels of the display module 310 to show a particular graphical user interface (GUI) to guide a user to perform a corresponding action. In accordance with various embodiments, the processor 320 may include one or more processing units, such as a microprocessor or an application-specific integrated circuit (ASIC) and/or the like.

The processor 320 may also provide a biometric detection function. Specifically, the processor 320 may control the display module 310 to display an image on screen of the display module 310. For the embodiments in which the display module 310 includes an LCD display panel, the processor 320 may control the liquid crystal layer and the backlight module of the display module 310 to show a particular graphical user interface (GUI) to guide a user to perform a corresponding action. Oppositely, for the embodiments in which the display module 310 includes an OLED display panel or an mLED display module, the processor 320 may control light illuminating elements (e.g. OLEDs or mLEDs) respectively in the pixels of the display module 310 to show a particular graphical user interface (GUI) to guide a user to perform a corresponding action. In some further embodiments, the processor 320 may perform an operation on the photo detection signals, so as to construct a biometric pattern corresponding to the biometric object based on the photo detection signals. In some embodiments, the processor 320 includes the detection circuit 130 in FIG. 8 or another circuit suitable to perform similar functions to those of the detection circuit 130. The biometric pattern may be a fingerprint pattern if the biometric object is a fingerprint of a human finger.

The biometric detection function may be separated from the processor 320 in accordance with variant embodiments. For example, a detection circuit (such as the detection circuit 130) with the biometric detection function other than the processor 320 may be included in the electronic device 300.

The memory 330 stores the instructions that are executed by the processor 320. In addition, the memory 330 may store the processing result (such as data corresponding to the biometric pattern) from the processor 320. The memory 330 may be, for example, an erasable programmable ROM (EPROM), an electrically erasable programmable ROM (EEPROM), a random access memory (RAM), a CD-R, a magnetic tape, a hard disk, a solid state disk (SSD), a flash memory or other data storage device suitable for storing a program code, but is not limited thereto.

Figure 12:
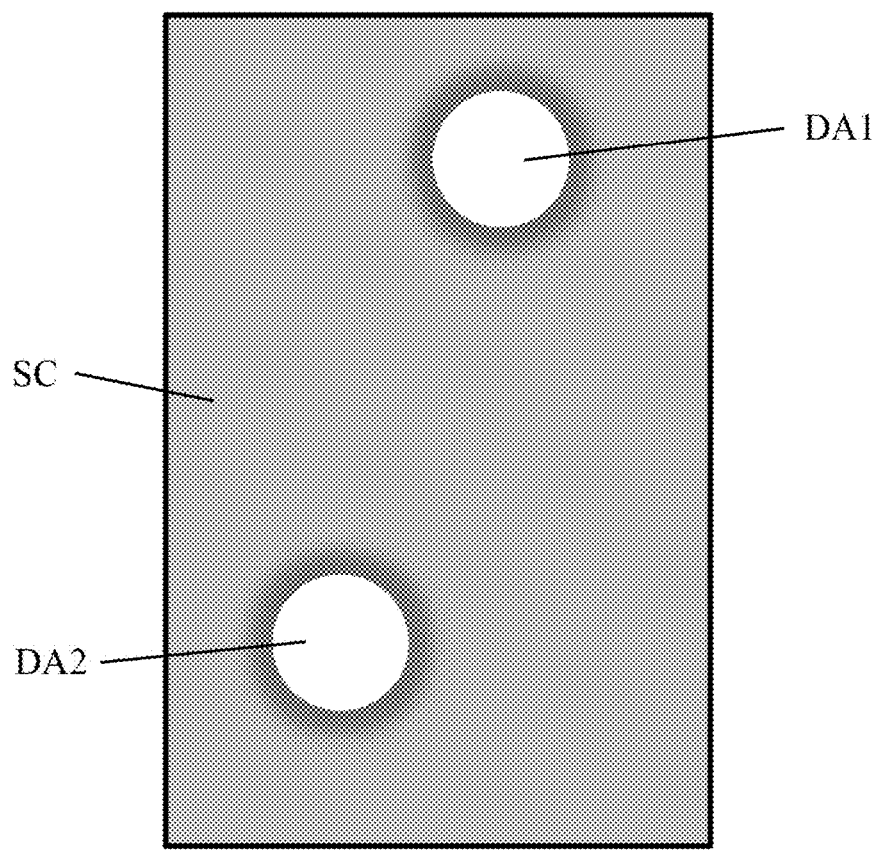
FIG. 12 exemplarily shows a graphical user interface (GUI) displayed on screen of the electronic device in FIG. 11.

FIG. 12 exemplarily shows a graphical user interface (GUI) displayed on screen of the electronic device 300 for biometric detection in accordance with some embodiments of the invention. In the following, the biometric detection function for fingerprint detection is exemplified. As shown in FIG. 12, when starting the biometric detection function, the GUI is shown on screen SC, in which detection areas DA1 and DA2 are brighter than the other area, so as to guide a user to press his finger onto the screen SC and in the detection area DA1 or DA2 for reflected light sensing.

Figure 13:
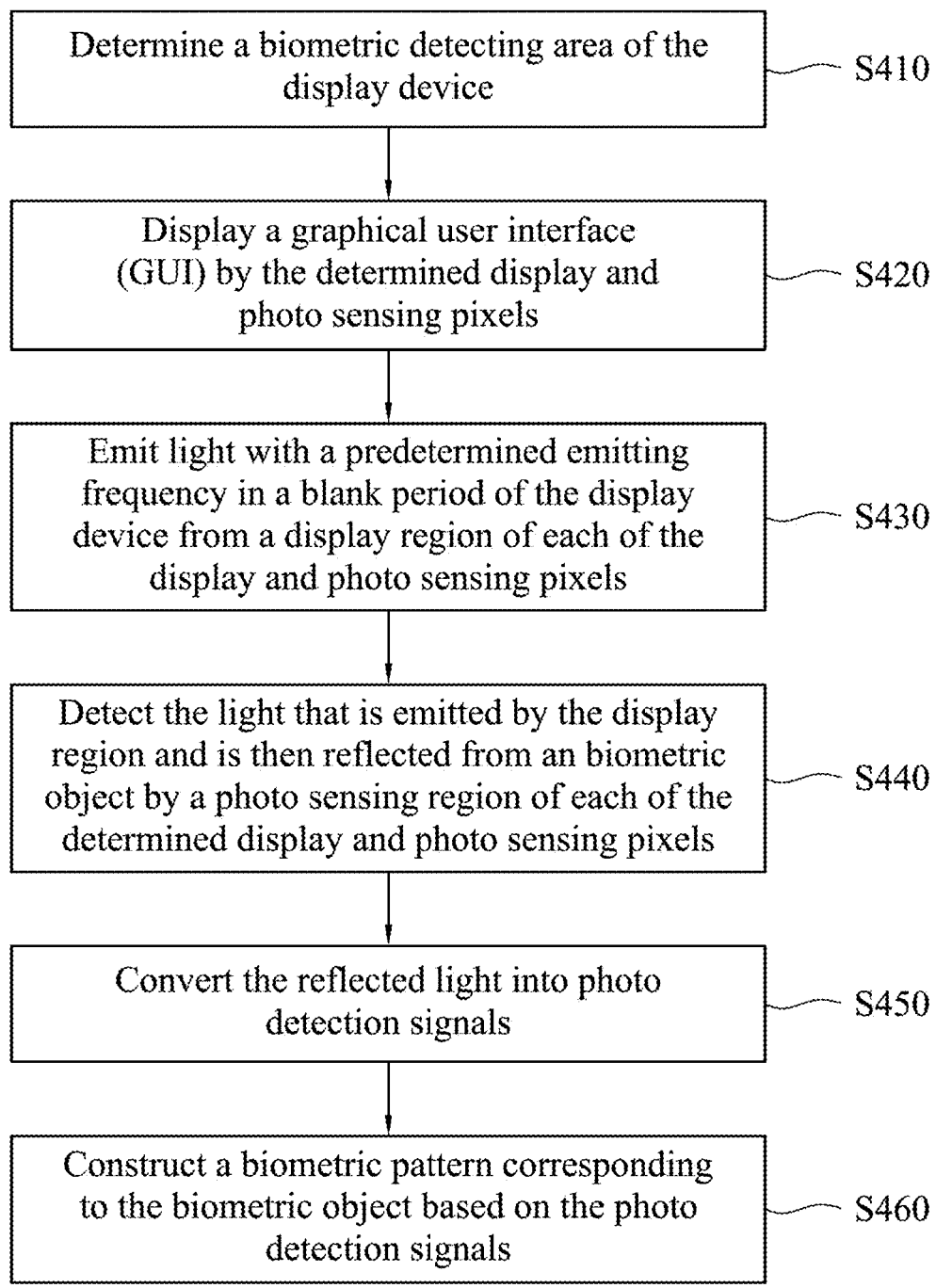
FIG. 13 is a flowchart diagram of a biometric detection method in accordance with some embodiments of the invention.

FIG. 13 is a flowchart of a biometric detection method 400 in accordance with one or more embodiments of the invention. The biometric detection method 400 may be applied on various types of electronic devices, such as the electronic device 300 shown in FIG. 11 or another electronic device in which the display module has a pixel arrangement similar to that of the display device 100. In the following description, the display module on which the biometric detection method 400 is applied has an active matrix substrate with pixels that are configured to display an image and include display and photo sensing pixels, and each of the display and photo sensing pixels includes a display region and a photo sensing region, e.g., as shown in FIG. 3.

The biometric detection method 400 includes the following steps. In Step 410, a biometric detecting area of the display module is determined, in which determined ones of the display and photo sensing pixels are in the biometric detecting area. The number of the determined ones of the display and photo sensing pixels in the biometric detecting area may be less than or equal to the number of the display and photo sensing pixels. Then, the display region of each of the determined display and photo sensing pixels is controlled to activate light emitting with a predetermined emitting frequency in a blank period of the display module, and the photo sensing region of each of the determined display and photo sensing pixels is control to activate biometric object sensing.

In Step S420, the display module is controlled to display a GUI that indicates the biometric detecting area, in order to guide a user to perform a corresponding action. If the biometric detection method 400 is performed to detect a fingerprint, the GUI (e.g. as shown in FIG. 12) may be displayed to guide a user to press his finger onto a screen of the display module for fingerprint detection.

In Step S430, light is emitted with a predetermined emitting frequency in a blank period (i.e. a non-display period) of the display device by a display region of each of the display and photo sensing pixels. The predetermined emitting frequency in the blank period may be high than a human eye is aware of, i.e., the human eyes is not aware of light hopping. In some embodiments, the predetermined emitting frequency in the blank period is higher than 60 Hz (in particular, about $10^5$ Hz) and may be adjusted according to circuit characteristics. The light may be emitted by one or more backlight sources, OLEDs or mLEDs according to the type of the display device, such as an LCD device, an OLED display device, an mLED display device or the like.

When a biometric object is placed onto a display surface of the electronic device, the light emitted from the display region is then reflected by the biometric object (e.g. as shown in FIG. 5 and FIG. 7).

In Step S440, the light emitted from the display region and then reflected from the biometric object is detected by a photo sensing region of each of the determined display and photo sensing pixels. The photo sensing region may include a photo sensing element for detecting the light, such as a photodiode, a pinned photodiode, a partially pinned photodiode, a photogate, a photo transistor, or another element that has a light sensing function.

In Step S450, the reflected light is converted into photo detection signals by the photo sensing element in each of the photo sensing region, and then the photo detection signals are transmitted to a detection circuit. The detection circuit may be included the display device and may be such as the detection circuit shown in FIG. 3 or another detection circuit suitable for performing an operation on the photo detection signals.

In Step S460, the detection circuit performs an operation on the photo detection signals, so as to construct a biometric pattern corresponding to the biometric object based on the photo detection signals. The biometric pattern may be a fingerprint pattern if the biometric object is a fingerprint of a human finger.

It is noted that Step S410 and Step S420 may be performed by a processor that is configured to control the display module. The processor may be, for example, the processor 320 in FIG. 3 or another processor that is capable of controlling the display module (e.g. controlling a backlight module and a liquid crystal layer of the display module). In particular, Step S410 and Step S420 may be compiled into a program code, and such compiled program code may be stored in a memory. When performing the biometric detection method 400, the processor may read and execute the program code stored in the memory to perform operations of Step 410 and Step 420.

In summary, according to the embodiments of the invention described above, a biometric detection function is embedded in a display screen without requiring additional displacement in a non-active region for biometric detection and affecting original image display, thus providing more conveniently and flexibly.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A liquid crystal display device, comprising:
   a backlight module having a backlight source that is configured to emit backlight, wherein the backlight source is configured to be turned on and off repeatedly in a predetermined emitting frequency in a blank period of the liquid crystal display device and to be kept turn-on throughout a display period of the liquid crystal display device, wherein the predetermined emitting frequency is higher than a human eye is aware of; and
   an active matrix substrate disposed over the backlight module and having a plurality of pixels that are configured to display an image, wherein at least some of the plurality of pixels are display and photo sensing pixels for biometric detection, each of the display and photo sensing pixels comprising:
      a display region configured to repeatedly emit light in the predetermined emitting frequency in the blank period of the liquid crystal display device and to continuously emit light in the display period of the liquid crystal display device in the display period of the liquid crystal display device according to the backlight; and
      a photo sensing region adjacent to the display region, the photo sensing region configured to detect the light emitted by the display region and reflected from a biometric object and to convert the reflected light into photo detection signals in the blank period of the liquid crystal display device; and
   a detection circuit coupled to the photo sensing region of each of the display and photo sensing pixels, the detection circuit configured to construct a biometric pattern corresponding to the biometric object based on the photo detection signals.

2. The liquid crystal display device of claim 1, wherein the biometric pattern is a fingerprint pattern.

3. The liquid crystal display device of claim 1, wherein a number of the display and photo sensing pixels is less than a number of the plurality of pixels.

4. The liquid crystal display device of claim 1, wherein each of the pixels comprises a red subpixel, a green subpixel and a blue subpixel.

5. An electronic device, comprising:
a liquid crystal display module comprising:
  a backlight module having a backlight source that is configured to emit backlight; and
  an active matrix substrate disposed over the backlight module and having a plurality of pixels that are configured to display an image, wherein at least some of the plurality of pixels are display and photo sensing pixels for biometric detection, each of the display and photo sensing pixels comprising:
    a display region configured to emit light according to the backlight; and
    a photo sensing region adjacent to the display region, the photo sensing region configured to detect the light emitted by the display region and reflected from a biometric object and to convert the reflected light into photo detection signals;
a detection circuit coupled to the photo sensing circuit of each of the display and photo sensing pixels, the detection circuit configured to construct a biometric pattern corresponding to the biometric object based on the photo detection signals; and
a processor configured to execute instructions to:
  determine a biometric detecting area of the liquid crystal display module, wherein determined ones of the display and photo sensing pixels are in the biometric detecting area;
  control the backlight module to provide the backlight in a predetermined emitting frequency by repeatedly turning on and off the backlight source in a predetermined emitting frequency in a blank period of the liquid crystal display module, wherein the predetermined emitting frequency is higher than a human eye is aware of;
  control the display region of each of the determined display and photo sensing pixels to activate light emitting repeatedly in the predetermined emitting frequency according to the backlight in the blank period of the liquid crystal display module;
  keep the backlight source turn-on throughout a display period of the liquid crystal display module;
  control the display region of each of the determined display and photo sensing pixels to continuously emit light according to the backlight in the display period of the liquid crystal display module; and
  control the photo sensing region of each of the determined display and photo sensing pixels to activate biometric object sensing in the blank period of the liquid crystal display module.

6. The electronic device of claim 5, wherein the processor is further configured to execute the instructions to control the liquid crystal display module to display a graphical user interface (GUI) that indicates the biometric detecting area.

7. The electronic device of claim 5, wherein the biometric pattern is a fingerprint pattern.

8. The electronic device of claim 5, wherein a number of the display and photo sensing pixels is less than a number of the plurality of pixels.

9. The electronic device of claim 5, wherein a number of the determined display and photo sensing pixels is less than a number of the display and photo sensing pixels.

10. The electronic device of claim 5, wherein each of the pixels comprises a red subpixel, a green subpixel and a blue subpixel.

11. The electronic device of claim 5, further comprising:
a memory configured to store the instructions.

12. A biometric detection method of a liquid crystal display device, the liquid crystal display device having a backlight module and an active matrix substrate disposed over the backlight module, the backlight module having a backlight source that is configured to emit backlight, the active matrix substrate having a plurality of pixels that are configured to display an image, wherein at least some of the plurality of pixels are display and photo sensing pixels, the biometric detection method comprising:
providing the backlight in a predetermined emitting frequency by repeatedly turning on and off the backlight source in a blank period of the liquid crystal display device, wherein the predetermined emitting frequency is higher that a human eye is aware of;
providing the backlight by keeping the backlight source turn-on throughout a display period of the liquid crystal display device;
repeatedly emitting light in the predetermined emitting frequency by a display region of each of the display and photo sensing pixels according to the backlight in the blank period of the liquid crystal display device;
continuously emitting light according to the backlight in the display period of the liquid crystal display device;
detecting the light that is reflected from a biometric object by a photo sensing region of each of the display and photo sensing pixels in the blank period of the liquid crystal display device;
converting the reflected light into photo detection signals; and
constructing a biometric pattern corresponding to the biometric object based on the photo detection signals.

13. The biometric detection method of claim 12, further comprising:
determining a biometric detecting area of the liquid crystal display device, wherein determined ones of the display and photo sensing pixels are in the biometric detecting area; and
displaying a graphical user interface (GUI) by the determined display and photo sensing pixels, the GUI indicating the biometric detecting area.

14. The biometric detection method of claim 12, wherein the biometric pattern is constructed as a fingerprint pattern.

15. The liquid crystal display device of claim 1, wherein the detection circuit comprises:
a narrow band pass filter configured to pass components of the photo detection signals with a particular frequency or within a particular frequency range and blocks the other components of the photo detection signals out of the particular frequency or the particular frequency range;
an analog-to-digital converter coupled to an output of the narrow band pass filter and configured to convert the photo detection signals from an analog form to a digital form; and
a digital filter coupled to an output of the analog-to-digital converter and configured to define regions corresponding to two opposite characteristics of the biometric object to generate a biometric image.

16. The electronic device of claim 5, wherein the detection circuit comprises:
a narrow band pass filter configured to pass components of the photo detection signals with a particular frequency or within a particular frequency range and blocks the other components of the photo detection signals out of the particular frequency or the particular frequency range;
an analog-to-digital converter coupled to an output of the narrow band pass filter and configured to convert the photo detection signals from an analog form to a digital form; and
a digital filter coupled to an output of the analog-to-digital converter and configured to define regions corresponding to two opposite characteristics of the biometric object to generate a biometric image.

* * * * *